(12) United States Patent
Jung et al.

(10) Patent No.: US 7,684,254 B2
(45) Date of Patent: Mar. 23, 2010

(54) FLASH MEMORY DEVICE AND METHOD OF ERASING MEMORY CELL BLOCK IN THE SAME

(75) Inventors: Min Joong Jung, Seongnam-si (KR); Byoung Kwan Jeong, Jeonju-si (KR); Tai Kyu Kang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 92 days.

(21) Appl. No.: 11/617,670

(22) Filed: Dec. 28, 2006

(65) Prior Publication Data

US 2008/0084766 A1    Apr. 10, 2008

(30) Foreign Application Priority Data

Sep. 29, 2006    (KR)    ...................... 10-2006-0096184

(51) Int. Cl.
*G11C 16/04*    (2006.01)
(52) U.S. Cl. ............................. 365/185.29; 365/185.22; 365/185.11
(58) Field of Classification Search ............ 365/185.29, 365/218, 185.22, 185.11
See application file for complete search history.

(56) References Cited

U.S. PATENT DOCUMENTS 5,371,702 A * 12/1994 Nakai et al. ............ 365/185.11
6,456,517 B2 * 9/2002 Kim et al. ...................... 365/51
6,862,222 B2    3/2005 Roohparvar
7,110,301 B2 * 9/2006 Lee et al. ................ 365/185.29
7,277,329 B2 * 10/2007 Chen et al. ................ 365/185.3
2004/0202042 A1 * 10/2004 Chae et al. ................... 365/233
2007/0019484 A1 * 1/2007 No .............................. 365/203

FOREIGN PATENT DOCUMENTS

| JP | 2000-348492 A | 12/2000 |
|---|---|---|
| KR | 10-2001-0004269 A | 1/2001 |
| KR | 10-2001-0037587 A | 5/2001 |
| KR | 10-2002-0001251 A | 1/2002 |
| KR | 10-2004-0004895 A | 1/2004 |
| KR | 10-2006-0024146 A | 3/2006 |

* cited by examiner

*Primary Examiner*—Hoai V Ho
*Assistant Examiner*—Kretelia Graham
(74) *Attorney, Agent, or Firm*—Townsend and Townsend and Crew LLP

(57) ABSTRACT

A flash memory device comprises a memory cell array having a plurality of blocks. An address register section is configured to receive a start block address of the first block to be erased among a plurality of blocks to be erased and a last block address of the last block to be erased among the plurality of blocks to be erased. A controlling logic circuit is configured to output an erase command signal and an erase block address corresponding to one of the blocks to be erased. A block address comparing section is configured to compare the erase block address output by the controlling logic circuit with the last block address, and output an erase progress signal based on the comparison of the erase block address and the last block address to the controlling logic circuit. The controlling logic circuit outputs an erase block address of to another block to be erased until the erase progress signal indicates that the last block to be erased has been or is being erased.

6 Claims, 2 Drawing Sheets

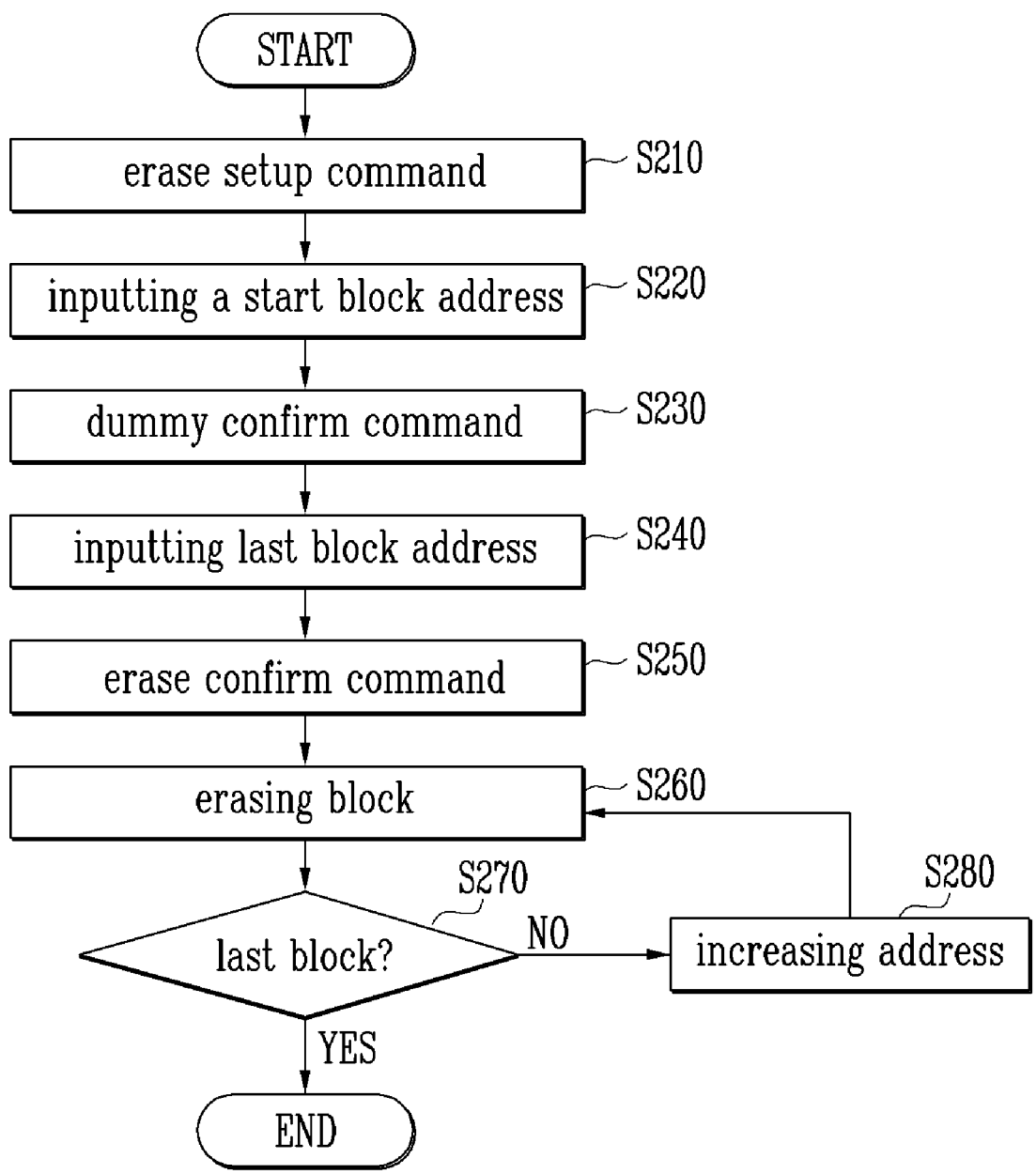

FLASH MEMORY DEVICE AND METHOD OF ERASING MEMORY CELL BLOCK IN THE SAME

CROSS-REFERENCE TO RELATED APPLICATIONS

This application claims priority from Korean Patent Application No. 2006-96184, filed on Sep. 29, 2006, the contents of which are incorporated herein by reference in its entirety.

BACKGROUND OF THE INVENTION

The present invention relates to a flash memory device and a method of increasing the speed of the erasing operation.

The flash memory device maintains data stored therein even when the power is not being supplied, i.e. the flash memory device is a type of nonvolatile memory device. This flash memory device is divided into a NOR flash memory device and a NAND flash memory device in accordance with the pattern of memory cell array included therein. The operation of the flash memory device is divided into a program operation, an erasing operation and a read operation.

A memory cell array in the NAND flash memory device includes a plurality of blocks, and each of the blocks has strings connected to a plurality of bit lines. Here, the string includes a drain select transistor connected to the bit line, a plurality of memory cells and a source select transistor connected to a common source line. Since this cell array in the NAND flash memory device is well-known, further description concerning the cell array will be omitted.

The erasing operation of the NAND flash memory device is performed in units of block. That is, all flash memory cells included in a block are erased during an erase operation. When several blocks need to be erased, the address of a first block to be erased is inputted, and then the first block is erased. The address of a second block next to the first block is inputted after the first block has been erased, so that the second block may be erased.

In brief, the address corresponding to a specific block always needs to be inputted to erase that block according to the conventional erase technique. In other words, when erasing N (integer above 2) blocks, all N addresses need to be inputted.

SUMMARY OF THE INVENTION

It is a feature of the present invention to provide a flash memory device and a method of erasing memory cell blocks by storing the address of the start block and last block, erasing the blocks in series, and then finishing the whole erasing operation when the last block is erased, and so the speed of the erasing operation is increased.

A flash memory device according to one embodiment of the present invention includes a memory cell array, an address register section, a controlling logic circuit, a high voltage generator, a block selecting section, an erase block address storing section and a block address comparing section. The memory cell array has a plurality of blocks. The address register section stores a start block address corresponding to the first block to be erased and a last block address corresponding to the last block to be erased. The controlling logic circuit outputs an erasing command signal and an erase block address. The high voltage generator outputs erasing voltages required for an erasing operation in accordance with the erasing command signal. The block selecting section transmits the erasing voltages to corresponding block in accordance with the erase block address. The erase block address storing section stores the erase block address outputted from the controlling logic circuit. The block address comparing section compares the last block address with the erase block address, and outputs an erase progressing signal to the controlling logic circuit.

A method of erasing blocks in a flash memory device according to one embodiment of the present invention includes; storing a start block address corresponding to address of the first block to be erased; storing a last block address corresponding to the address of the last block to be erased; and performing erasing operations from the block selected by the start block address to the block selected by the last block address.

In one embodiment, a flash memory device comprises a memory cell array having a plurality of blocks. An address register section is configured to receive a start block address of the first block to be erased among a plurality of blocks to be erased and a last block address of the last block to be erased among the plurality of blocks to be erased. A controlling logic circuit is configured to output an erase command signal and an erase block address corresponding to one of the blocks to be erased. A block address comparing section is configured to compare the erase block address output by the controlling logic circuit with the last block address, and output an erase progress signal based on the comparison of the erase block address and the last block address to the controlling logic circuit. The controlling logic circuit outputs an erase block address of to another block to be erased until the erase progress signal indicates that the last block to be erased has been or is being erased. The erase progress signal indicates that the last block to be erased has been erased when the erase block address output by the controlling logic circuit corresponds to the last block address.

In one embodiment, the memory device further comprises an erase block address storing section configured to receive the erase block address outputted from the controlling logic circuit and output the erase block address to the block address comparing section. A high voltage generator is configured to output an erase voltage required for an erasing operation in accordance with the erase command signal output by the controlling logic circuit. A block selecting section is configured to transmit the erase voltages to a block corresponding to the erase block address.

In one embodiment, the address register section includes a first address register configured to store the start block address and a second address register configured to store the last block address. The address register section and the block address comparing section share the second address register.

In another embodiment, a method of erasing blocks in a flash memory device comprises storing a start block address corresponding to an address of the first block to be erased among a plurality of blocks to be erased. A last block address corresponding to an address of the last block to be erased among the plurality of blocks to be erased is stored. An erase operation is performed starting with the first block until the last block is erased. Determination is made whether or not a block being erased or has been erased most recently corresponds to the last block to be erased among the plurality of blocks. The erase operation is ended according to the determining step.

The step of the performing the erasing operation includes erasing the block selected by the started block address; and selecting another block address from the plurality of blocks to be erased, wherein the erasing and selecting steps above are repeated until the last block has been erased.

BRIEF DESCRIPTION OF THE DRAWINGS

FIG. 2 is a flow chart illustrating a method of erasing blocks in the flash memory device according to one embodiment of the present invention.

DESCRIPTION OF SPECIFIC EMBODIMENTS

Figure 1:
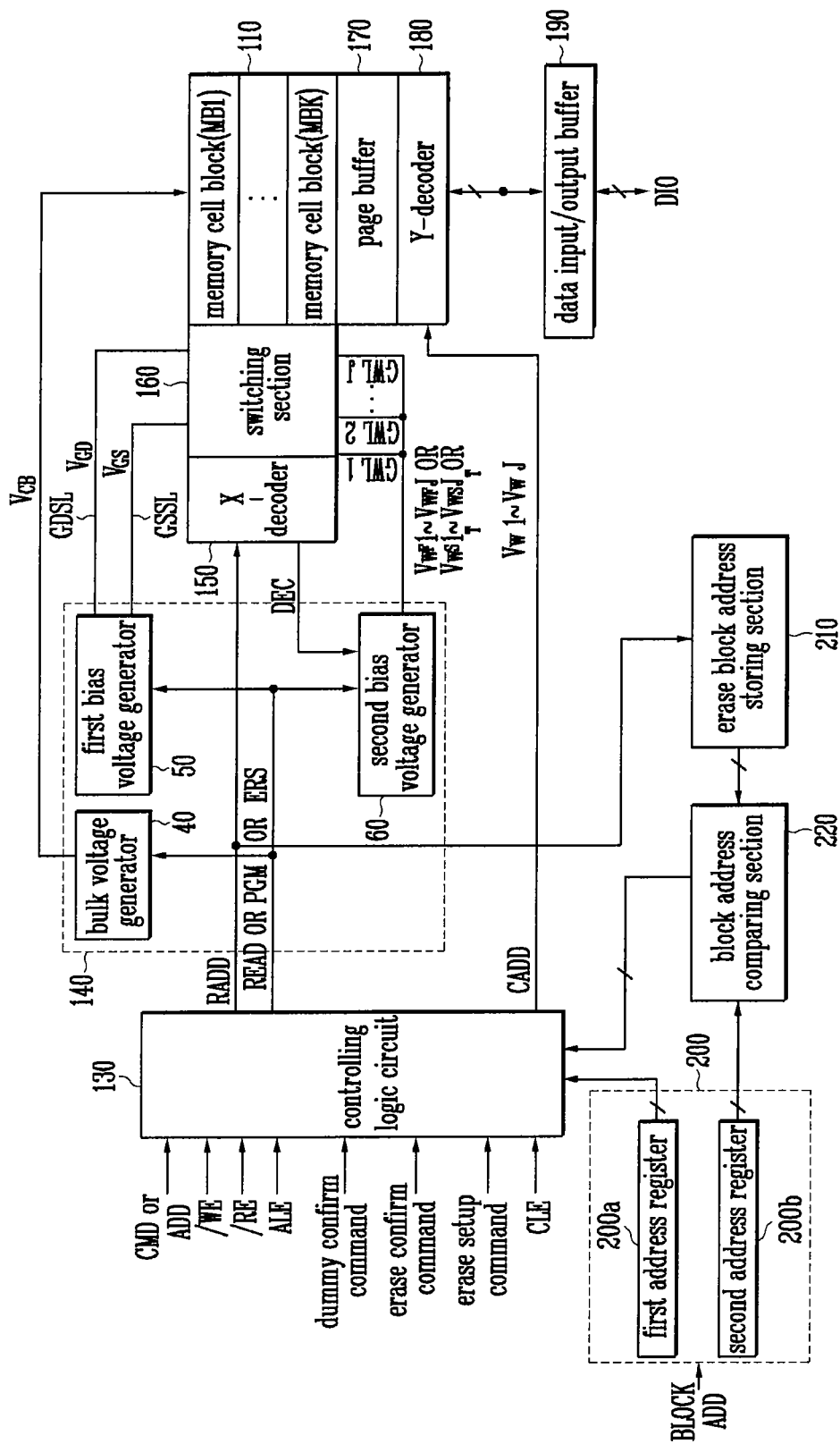
FIG. 1 is a view illustrating circuitry of a flash memory device according to one embodiment of the present invention.

FIG. 1 is a circuit diagram of a flash memory device according to one embodiment of the present invention. The flash memory device of the present embodiment includes a memory cell array 110, a controlling logic circuit 130, a high voltage generator 140, a X-decoder 150, a switching section 160, a page buffer 170, a Y-decoder 180, a data input/output buffer 190, an address register section 200, an erase block address storing section 210 and a block address comparing section 220. Here, the X-decoder 150 and the switching section 160 form a block selecting section.

The memory cell array 110 includes memory cell blocks MB1 to MBK having a plurality of memory cells (not shown), where K is an integer.

The controlling logic circuit 130 receives a command signal CMD or an address signal ADD in response to outside controlling signals /WE, /RE, ALE, CLE, and generates one of a read command READ, a program command PGM and an erasing command ERS in response to the command signal CMD. In addition, the controlling logic circuit 130 generates a row address signal RADD and a column address signal CADD on the basis of the address signal ADD.

The high voltage generator 140 includes a bulk voltage generator 40, a first bias voltage generator 50 and a second bias voltage generator 60.

The bulk voltage generator 40 generates and provides a bulk voltage VCB to the P-well of the memory cells in response to one of the read command READ, the program command PGM and the erasing command ERS.

The bulk voltage generator 40 generates a low voltage level (e.g., VCB=0V) in response to the read command READ or the program command PGM. Additionally, the bulk voltage generator 40 generates a high voltage level (e.g., VCB=16V to 20V) in response to the erasing command ERS.

The first bias voltage generator 50 generates a drain bias voltage VGD and a source bias voltage VGS in response to one of the read command READ, the program command PGM and the erasing command ERS. In addition, the first bias voltage generator 50 supplies the drain bias voltage VGD to a global drain selecting line GDSL, and supplies the source bias voltage VGS to a global source selecting line GSSL. Particularly, in response to the read command READ, the first bias voltage generator 50 generates a high voltage level for the drain bias voltage VGD and the source bias voltage VGS (e.g., VGD=VGS=4.5V). Further, in response to the program command PGM, the first bias voltage generator 50 generates the drain bias voltage VGD with VGD=Vcc (not shown) and the source bias voltage VGS with a low voltage level. Moreover, in response to the erasing command ERS, the first bias voltage generator 50 generates the drain bias voltage VGD and the source bias voltage VGS having a low voltage level.

In response to a decoding signal DEC and one of the read command READ, the program command PGM and the erasing command ERS, the second bias voltage generator 60 generates word line bias voltages VWF1 to VWFJ, word line bias voltages VWS1 to VWSJ or word line bias voltages VWT1 to VWTJ and supplies the generated voltages to the global word lines GWL1 to GWLJ, where J is an integer. Particularly, the second bias voltage generator 60 generates the word line bias voltages VWF1 to VWEJ in response to the read command READ. In addition, the second bias voltage generator 60 generates the word line bias voltages VWS1 to VWSJ in response to the program command PGM. Further, the second bias voltage generator 60 generates the word line bias voltages VWT1 to VWTJ in response to the erasing command ERS.

The X-decoder 150 decodes the row address signal RADD, and outputs the decoding signal DEC.

The switching section 160 selects one or some of the memory cell blocks MB1 to MBK in response to the decoding signal DEC, and couples local word lines (not shown) of the selected memory cell block (or memory cell blocks) to the global word lines GWL1 to GWLJ, respectively.

The switching section 160 couples drain selecting line (not shown) of the selected memory cell block to the global drain selecting line GDSL, and couples source selecting line (not shown) of the selected memory cell block to the global source selecting line GSSL.

Since the page buffer 170, the Y-decoder 180 and the data input/output buffer 190 are well-known art, further description concerning the elements 170, 180 and 190 will be omitted.

The address register section 200 includes first and second address registers 200A and 200B, and stores the block addresses that will be erased. Particularly, the first address register 200A stores the block address (hereinafter, referred to as "start block address") corresponding to the address of first block that erasing operation is performed on. Additionally, the second address register 200B stores block address (hereinafter, referred to as "last block address") corresponding to the address of the last block to be erased.

The erase block address storing section 210 stores the row address RADD or block address to be erased from the controlling logic circuit 130 when the erasing operation is performed. Generally, an erasing verifying operation is performed after the erasing operation is performed, and the verified result is outputted. If the erasing operation is properly performed in accordance with the verified result, the erase block address storing section 210 outputs the erase block address into a block address comparing section 220.

The block address comparing section 220 compares the last block address stored in the second address register 200B with the erase block address outputted from the erase block address storing section 210.

If the erase block address is different from the last block address, the block address comparing section 220 transmits an erase progressing signal to the controlling logic circuit 130 so that the erasing operation can progress to the next block.

However, in case that the erase block address is identical to the last block address, the block address comparing section 220 detects that last block of the blocks to be erased has been erased, and transmits an erase operation finishing signal to the controlling logic circuit 130. The erase progressing signal outputted from the block address comparing section 220 is also used as the erase operation enable signal of the controlling logic circuit 130. Further, the controlling logic circuit 130 determines whether the erasing operation for the next block is performed or if the erasing operation is finished in accordance with the erase progressing signal outputted from the block address comparing section 220, and outputs the erasing command ERS in accordance with the result.

In short, in the flash memory device of the present embodiment, the blocks to be erased may be erased in series without continually inputting the next block address after each erasing operation. Only the start block address and the last block address are required.

FIG. 2 is a flow chart illustrating a method of erasing blocks in the flash memory device according to one embodiment of the present invention.

Referring to FIG. 1 and FIG. 2, in step S210, an erase setup command is inputted so as to perform erasing operation. Here, the erase setup command may be inputted from a periphery circuit such as a CPU, etc.

In step S220, the start block address corresponding to the address of the first block to be erased is stored in the first address register section 200A of the address register section 200.

In step S230, the start block address is stored, and then a dummy confirm command is inputted. Here, the dummy confirm command may be a signal confirming that the input of the start block address is finished. This allows the timing of the last block address to be inputted after the start block address has been completed.

In step S240, the address of the last block to be erased is stored in the second address register 200B of the address register section 200 after the dummy confirm command is inputted. Here, since the time required for inputting the start block address, e.g. 3 clock cycles, is constant, the last block address may be inputted in series after certain period of time from the first register is loaded. In this case, the step of S230 may be omitted.

In step S250, an erase confirm command is inputted when the storage of the last block address is finished. Here, the erase confirm command may be generated from a periphery circuit such as the CPU, etc after adequate time to input the start block address and the last block address has lapsed, and is inputted to the controlling logic circuit 130.

In step S260, the erasing operation is performed when the erase confirm command in inputted. The controlling logic circuit 130 outputs the row address RADD or the block address corresponding to the start block address stored in the first address register 200A along with the erasing command signal ERS. The row address RADD or the block address is sent to the X-decoder 150 and also stored in the erase block address storing section 210. The bulk voltage generator 40, the first bias voltage generator 50 and the second bias voltage generator 60 output erasing voltages VCB, VGD, VGS and VWT1 to VWTJ required for the erasing operation in response to the erasing command signal ERS. The X-decoder 150 outputs a block selecting signal for selecting the block to be erased in accordance with the row address RADD. The switching section 160 couples the global word lines GWL1 to GWL to the local word lines of the block to be erased, couples the global drain select line GDSL to the local drain select line, and the global source select line GSSL to the local source select line in accordance with the block selecting signal so that the erasing voltages VCB, VGD, VGS and VWT1 to VWTJ are transmitted to flash memory cells in the block to be erased. As a result, the erasing voltages VCB, VGD, VGS and VWT1 to VWTJ are transmitted to the block to be erased, and so erasing operation is performed. After the erasing operation is finished, it is determined whether or not the erasing operation is normally finished. If the erasing operation is not normally finished, the erasing operation is performed again. If the erasing operation is performed again, the level of the bulk voltage VCB outputted from the bulk voltage generator 40 may be increased gradually.

In step S270, if the erasing operation is finished, it is detected whether or not the erased block is the last block of the blocks to be erased. Particularly, the erase block address storing section 210 outputs the stored erase block address to the block address comparing section 220. The block address comparing section 220 then compares the last block address stored in the second address register 200B with the erase block address.

If the last block address is different from the erase block address, the block address comparing section 220 outputs the erase progressing signal to the controlling logic circuit 130 so that the erasing operation can be performed on the next block.

In step S280, to progress the erasing operation to the next block, the controlling logic circuit 130 increases the row address RADD or block address. The erasing operation is then performed again in accordance with the increased row address RADD, i.e. the step S260 is performed again.

If the erase block address is identical to the last block address in step S270, every block to be erased has been, and so the erasing operation is finished. At this time, the block address comparing section 220 disables the erase progressing signal to the controlling logic circuit 130, thereby finishing the erasing operation.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment.

Although embodiments have been described with reference to a number of illustrative embodiments, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A method of erasing blocks in a flash memory device, the method comprising:
   storing a start block address corresponding to an address of the first block to be erased among a plurality of blocks to be erased;
   inputting a dummy confirm command for adjusting input timing of a last block address, the last block address corresponding to an address of the last block to be erased among the plurality of blocks to be erased;
   storing the last block address after inputting the dummy confirm command;
   performing an erase operation starting with the first block until the last block is erased;
   determining whether or not a block that is being erased or has been erased most recently corresponds to the last block to be erased among the plurality of blocks; and
   ending the erase operation according to the determining step.

2. The method of claim 1, further comprising:
   inputting an erase setup command for the erasing operation before storing the start block address.

3. The method of claim 1, further comprising:
   inputting an erase confirm command before the erasing operation.

4. The method of claim 1, wherein the step of the performing the erasing operation includes:
   erasing the block selected by the start block address; and
   increasing the start block address to select the next block to be erased, wherein the start block address is increased up to the last block address so that every block in the plurality of blocks to be erased is erased.

5. The method of claim 4, further comprising:
determining whether or not the erasing operation has been properly performed after performing the erasing operation.

6. The method of claim 1, wherein the step of the performing the erasing operation includes:

erasing the block selected by the start block address; and selecting another block address from the plurality of blocks to be erased, wherein the erasing and selecting steps are repeated until the last block has been erased.

* * * * *